(12) United States Patent
Shih et al.

(10) Patent No.: US 9,042,643 B2
(45) Date of Patent: May 26, 2015

(54) METHOD FOR DEMOSAICKING

(71) Applicant: Himax Imaging Limited, Tainan (TW)

(72) Inventors: Yen-Te Shih, Tainan (TW); Yuan-Chih Peng, Tainan (TW)

(73) Assignee: HIMAX IMAGING LIMITED, Tainan (TW)

( * ) Notice: Subject to any disclaimer, the term of this patent is extended or adjusted under 35 U.S.C. 154(b) by 146 days.

(21) Appl. No.: 13/922,934

(22) Filed: Jun. 20, 2013

(65) Prior Publication Data

US 2014/0376805 A1 Dec. 25, 2014

(51) Int. Cl.
G06K 9/00 (2006.01)
H04N 9/73 (2006.01)
H04N 9/083 (2006.01)
G06T 3/40 (2006.01)
H01L 27/146 (2006.01)

(52) U.S. Cl.
CPC ........ G06T 3/4015 (2013.01); H01L 27/14621 (2013.01); H04N 2209/045 (2013.01); H01L 27/14645 (2013.01); H04N 2209/046 (2013.01)

(58) Field of Classification Search
CPC ............ G06T 3/4015; H01L 27/14645; H01L 27/14621; H01L 27/146456; H04N 2209/045; H04N 2209/046
USPC .......................... 382/162, 167, 300, 305, 312; 348/222.1, 223.1, 272, 273
See application file for complete search history.

(56) References Cited

U.S. PATENT DOCUMENTS

| | | | | |
|---|---|---|---|---|
| 8,035,698 B2* | 10/2011 | Lukac | ........................ | 348/223.1 |
| 8,111,299 B2* | 2/2012 | Lukac | ........................ | 348/222.1 |
| 8,345,971 B2* | 1/2013 | Zhang et al. | .................. | 382/167 |
| 8,531,563 B2* | 9/2013 | Tanaka | .......................... | 348/273 |
| 8,571,312 B2* | 10/2013 | Chang et al. | .................. | 382/167 |
| 2010/0104214 A1* | 4/2010 | Tamburrino et al. | .......... | 382/276 |
| 2011/0032269 A1* | 2/2011 | Lukac et al. | .................. | 345/606 |

* cited by examiner

*Primary Examiner* — Kanjibhai Patel
(74) *Attorney, Agent, or Firm* — McClure, Qualey & Rodack, LLP

(57) ABSTRACT

A method for demosaicking a digital image is provided. Pixels of the digital image are processed in an order from the upper-left to lower-right of the digital image. If a current-processed pixel is a second color or a third color, a first sub-window centered at the current-processed pixel is generated. A first mask is used to select a first plurality of prior-processed pixels. A set of direction weightings of the current-processed pixel is calculated according to stored direction weightings of the first plurality of prior-processed pixels. An interpolating direction of the current-processed pixel is determined according to the set of direction weightings of the current-processed pixel. A value of a first color for the current-processed pixel is calculated based on the set of direction weightings of the current-processed pixel and values of the first color of pixels of the first color in the first sub-window.

19 Claims, 11 Drawing Sheets

FIG. 1

| $P_N$ | R0 | R1 | R2 | B0 | B1 |
|---|---|---|---|---|---|
| Interpolating direction | H | H | V | F | V |
| Recorded direction weighting | $W_H(R0)$ | $W_H(R1)$ | $W_V(R2)$ | $W_F(B0)$ | $W_V(B1)$ |
| Euclidean distance ($P_N \rightarrow R4$) | $\sqrt{8}$ | 2 | $\sqrt{8}$ | $\sqrt{2}$ | $\sqrt{2}$ |

FIG. 3b

| $P_N$ | R0 | R1 | R2 | R3 | R4 | R5 | R6 | |
|---|---|---|---|---|---|---|---|---|
| Interpolating direction | H | H | V | F | V | V | V | → A |
| Recorded direction weighting | $W_H(R0)$ | $W_H(R1)$ | $W_V(R2)$ | $W_F(R3)$ | $W_V(R4)$ | $W_V(R5)$ | $W_V(R6)$ | → B, → C |
| Euclidean distance ($P_N \rightarrow R4$) | $\sqrt{8}$ | 2 | $\sqrt{8}$ | 2 | 0 | 2 | $\sqrt{8}$ | → D |

FIG. 3d-1

| FIG. 3d-1 | FIG. 3d-2 |

| R7 | R8 | B0 | B1 | B2 | B3 |
|---|---|---|---|---|---|
| H | H | F | V | F | V |
| $W_V(R7)$ | $W_H(R8)$ | $W_F(B0)$ | $W_V(B1)$ | $W_F(B2)$ | $W_V(B3)$ |
| 2 | $\sqrt{8}$ | $\sqrt{2}$ | $\sqrt{2}$ | $\sqrt{2}$ | $\sqrt{2}$ |

METHOD FOR DEMOSAICKING

BACKGROUND OF THE INVENTION

1. Field of the Invention

The invention relates to digital image processing, and more particularly to demosaicking a digital image captured by an image sensor overlaid with a color filter array.

2. Description of the Related Art

Most digital cameras or image sensors use a color filter array, such as the well-known Bayer color filter array, to capture a digital image in order to reduce costs. In this way, each pixel in the captured image records a value of only one color. This kind of image is called a mosaicked image. FIG. 1 illustrates a structure of a Bayer pattern, wherein G is green, R is red, and B is blue. To reconstruct a full color image, a mosaicked image is demosaicked to obtain values of two missing colors for each pixel of the mosaicked image.

Some demosaicking processes can be roughly divided into two steps. The first step is to decide the interpolating direction of each pixel. The second step is to interpolate the values of two missing colors for each pixel along the decided interpolating direction. For example, some demosaicking processes use bilinear interpolation to estimate information of two missing colors for each pixel. In bilinear interpolation, the values of the two missing colors are calculated based on an average of the values of the neighboring pixels, in a vertical, horizontal and/or diagonal direction. However, artifacts, such as zipper effect or false color, might occur in the demosaicked image when the values of the two missing colors for each pixel are not interpolated along a proper interpolating direction, reducing image quality. The zipper effect makes a straight edge in the image looks like a zipper. Effects on a part of the artifacts can be diminished by preventing interpolation across the edge.

BRIEF SUMMARY OF THE INVENTION

In view of the above, the invention provides a method for demosaicking a digital image captured by an image sensor overlaid with a color filter array, wherein each of pixels of the digital image has one of a first color, a second color and a third color, and the pixels of the digital image are processed in an order from the upper-left to lower-right of the digital image. The method comprises: if a current-processed pixel is the second color or the third color, implementing a first process to the current-processed pixel to obtain a value of the first color. The first process comprises: generating a first sub-window centered at the current-processed pixel; using a first mask to select a first plurality of prior-processed pixels; calculating a set of direction weightings of the current-processed pixel according to stored direction weightings of the first plurality of prior-processed pixels; determining an interpolating direction of the current-processed pixel according to the set of direction weightings of the current-processed pixel; calculating a value of the first color for the current-processed pixel based on the set of direction weightings of the current-processed pixel and values of the first color of pixels of the first color in the first sub-window; and storing the largest one of the set of direction weightings, the interpolating direction and the value of the first color of the current-processed pixel.

In another embodiment, the invention provides a non-transitory machine-readable storage medium, having an encoded program code, wherein when the program code is loaded into and executed by a machine, the machine implements a method for demosaicking a digital image captured by an image sensor overlaid with a color filter array, wherein each of pixels of the digital image has one of a first color, a second color and a third color, and the pixels of the digital image are processed in an order from the upper-left to lower-right of the digital image, and the method comprises: if a current-processed pixel is the second color or the third color, implementing a first process to the current-processed pixel to obtain a value of the first color. The first process comprises: generating a first sub-window centered at the current-processed pixel; using a first mask to select a first plurality of prior-processed pixels; calculating a set of direction weightings of the current-processed pixel according to stored direction weightings of the first plurality of prior-processed pixels; determining an interpolating direction of the current-processed pixel according to the set of direction weightings of the current-processed pixel; calculating a value of the first color for the current-processed pixel based on the set of direction weightings of the current-processed pixel and values of the first color of pixels of the first color in the first sub-window; and storing the largest one of the set of direction weightings, the interpolating direction and the value of the first color of the current-processed pixel.

In still another embodiment, the invention provides an image signal processor for processing a digital image captured by an image sensor overlaid with a color filter array, wherein each of pixels of the digital image has one of a first color, a second color and a third color, and the pixels of the digital image are processed in an order from the upper-left to lower-right of the digital image. The image signal processor comprises a buffer module, receiving the digital image; a demosaicking module coupled to the buffer module, demosaicking each of the pixels of the digital image to reconstruct values of two other missing colors; a memory module coupled to the demosaicking module; an image processing module coupled to the demosaicking module, receiving values of the first color, the second color and the third color of each of the pixels to implement an image processing process to each of the pixels based on the values. If a current-processed pixel currently processed by the demosaicking module is the second color or the third color, the demosaicking module generates a first sub-window centered at the current-processed pixel, wherein a first mask is used to select a first plurality of prior-processed pixels. Also, a set of direction weightings of the current-processed pixel is calculated according to direction weightings of the first plurality of prior-processed pixels stored at the memory module, and an interpolating direction of the current-processed pixel is determined according to the set of direction weightings of the current-processed pixel and values of the first color of pixels of the first color in the first sub-window. A value of the first color for the current-processed pixel is determined based on the set of direction weightings of the current-processed pixel and values of the first color of pixels of the first color in the first sub-window. Next, the largest one of the set of direction weightings, the interpolating direction and the value of the first color of the current-processed pixel are stored at the memory module, and the value of the first color of the current-processed pixel is transmitted to the image processing module.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 1 illustrates a structure of Bayer pattern;

FIG. 3b illustrates an example of data of prior-processed pixels;

FIG. 3d-1 and FIG. 3d-2 illustrate an example of data of pixels;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
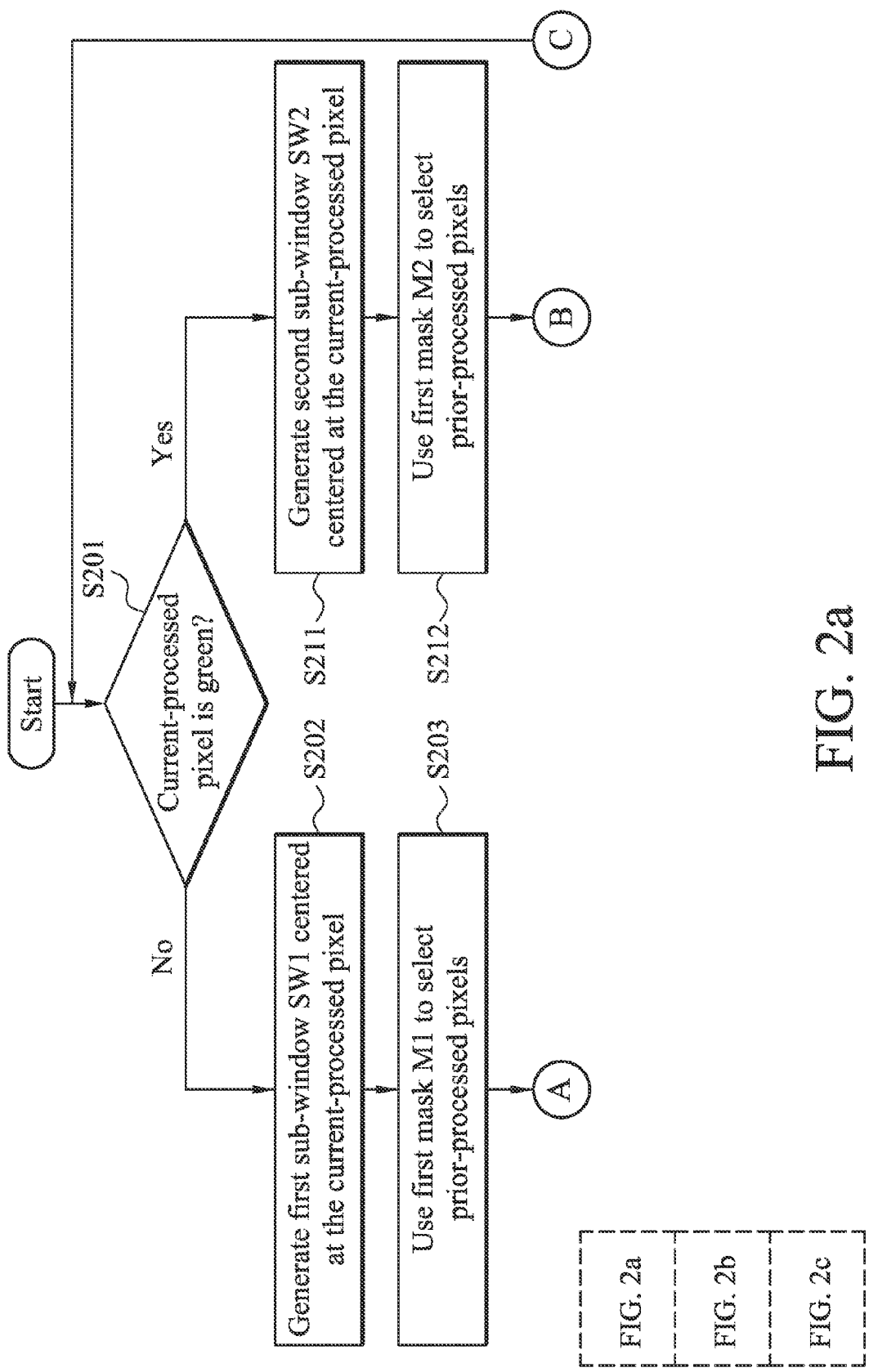
FIG. 2a~2c illustrate a flow chart of a method for demosaicking a digital image in accordance with an embodiment of the invention.
Figure 2B:
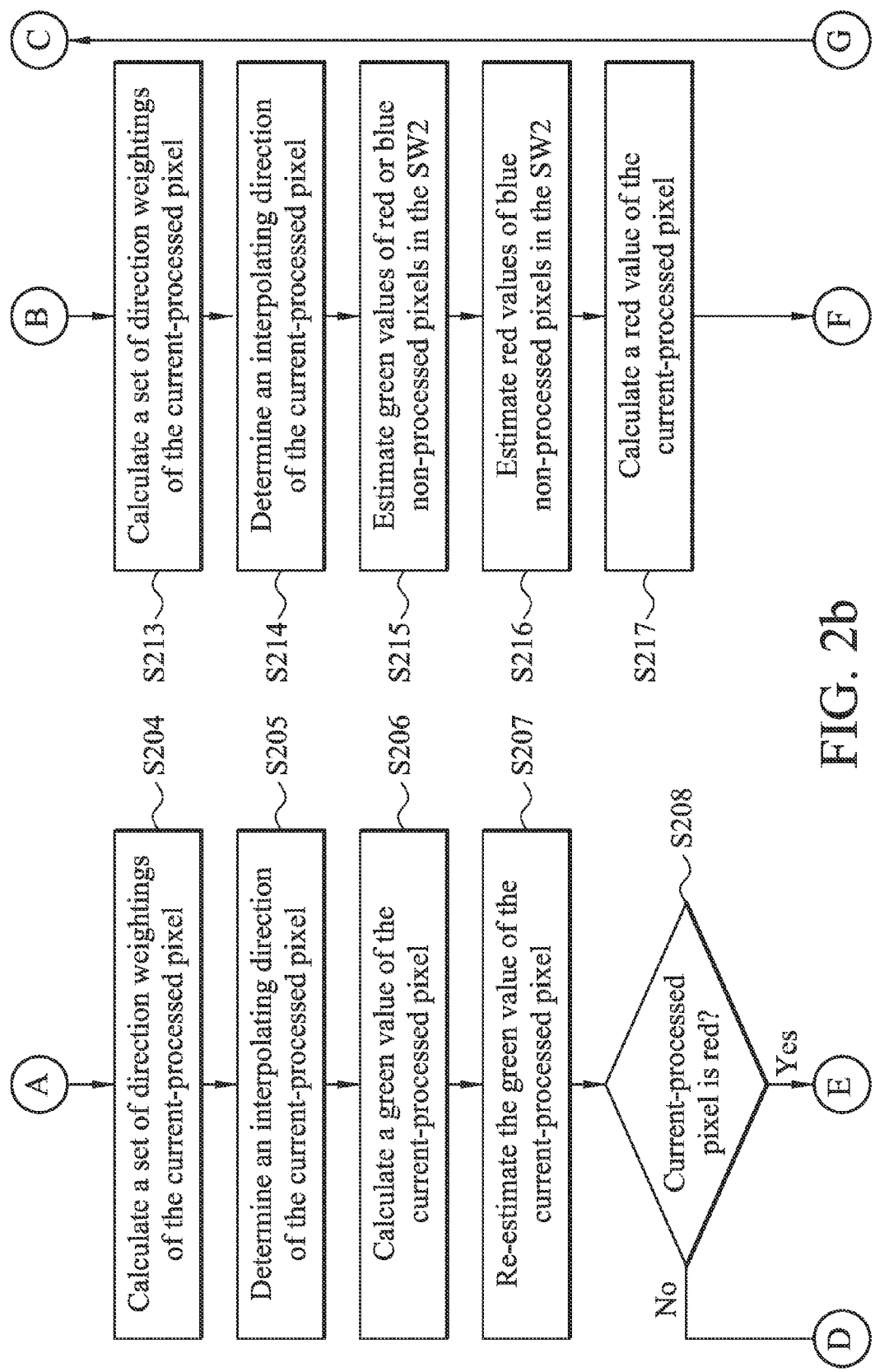
Figure 2C:
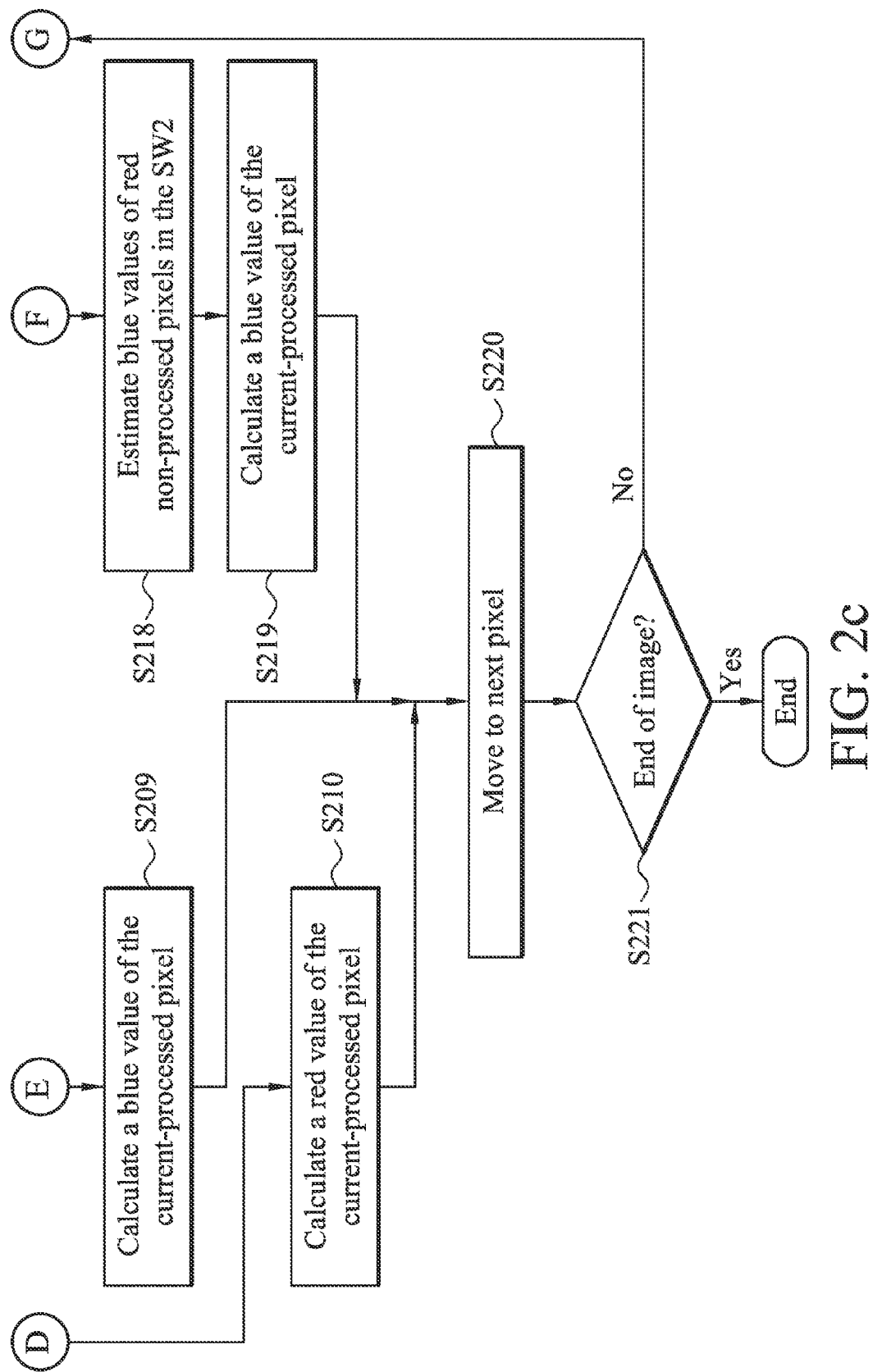

FIG. 2a~2c illustrate a flow chart of a method for demosaicking a digital image in accordance with an embodiment of the invention. In this embodiment, the digital image is captured by an image sensor overlaid with a Bayer color filter array. Each pixel of the digital image has only a green value, a red value or a blue value. Note that, a person having ordinary skill in the art can use other types of color filter arrays instead of the Bayer color filter array described herein. The method is implemented by an image signal processor. If the image signal processor uses a line-based scanning scheme to output the processed digital image without more full-color buffers, it may need to generate a sub window centered at a current-processed pixel to implement demosaicking or other image processing in other image pipelines, such as sharpening, smoothing or/and denoising. Pixels of the digital image are processed in an order from the upper-left to lower-right of the digital image, that is the scan scheme is upper-left to lower-right.

Figure 3A:
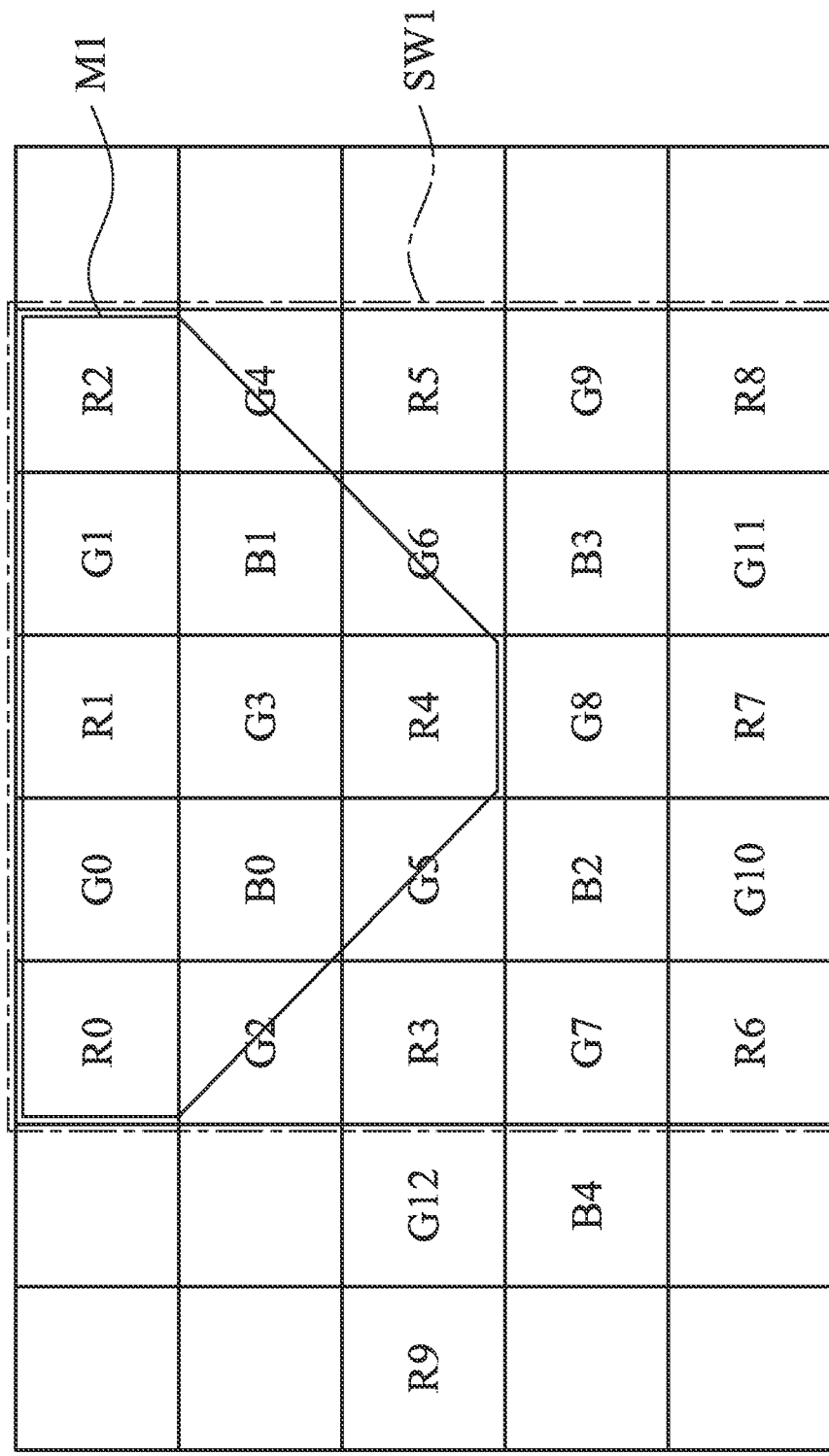
FIG. 3a illustrates an example of demosaicking a pixel which is not green.
Figure 3C:
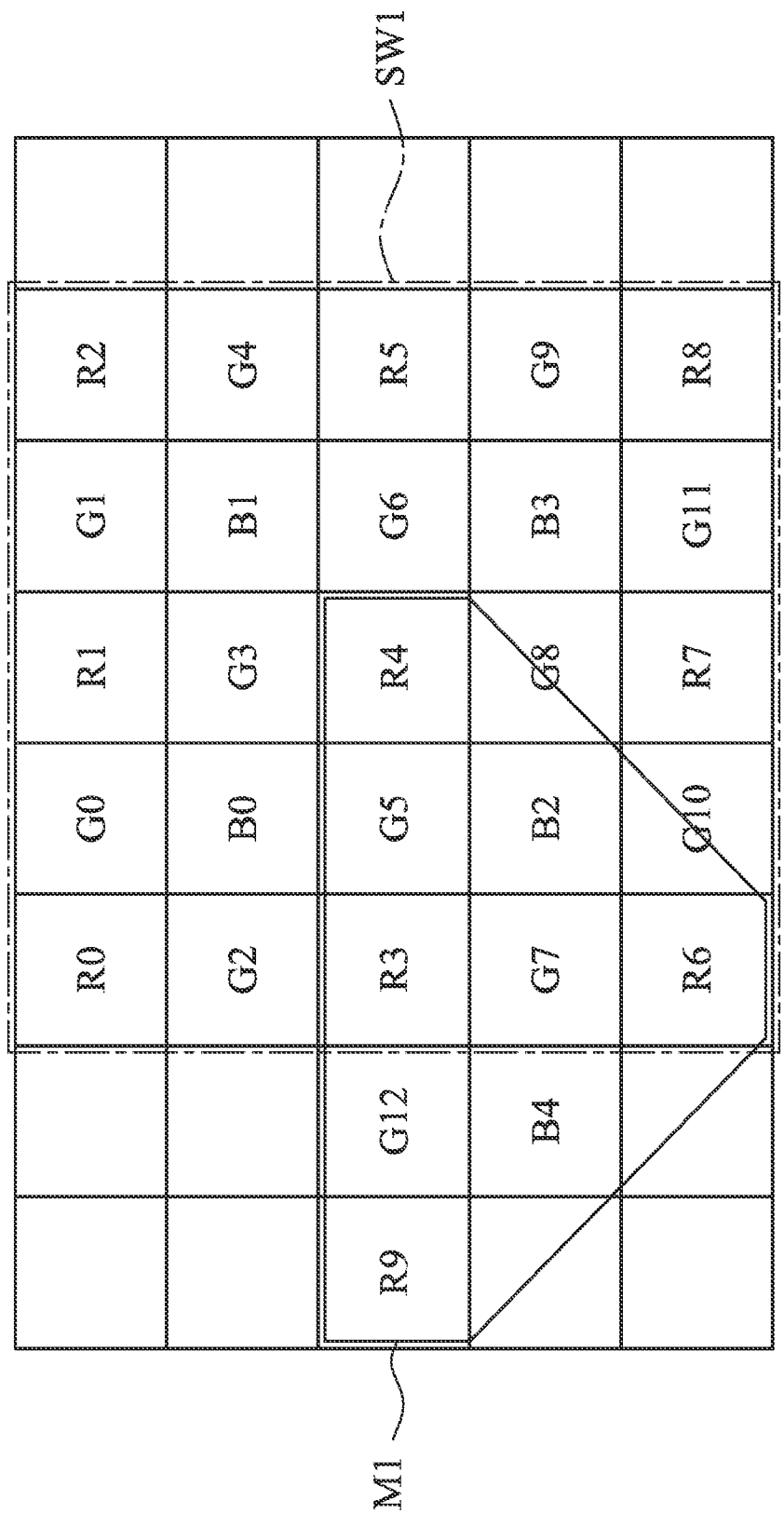
FIG. 3c illustrates an example of estimating an interpolating direction of a non-processed pixel.

In step S201, it is determined whether a current-processed pixel is green or not. If the current-processed pixel is not green (step S201: No), a first process (steps S202~S206), a re-estimating process (step S207) and a third process (steps S208~S210) are implemented to the current-processed pixel to obtain values of two missing colors of the current-processed pixel. If the current-processed pixel is green (step S201: Yes), a second process (steps S211~S219) is implemented to the current-processed pixel to obtain a red value and a blue value of the current-processed pixel. In the first process, a first sub-window SW1 centered at the current-processed pixel is generated at step S202, as shown in FIGS. 3a and 3c. FIGS. 3a and 3c show a part of a digital image captured by an image sensor overlaid with a Bayer color filter array. Therefore, G0~G12 denote green pixels, R0~R9 denote red pixels, and B0~B4 denote blue pixels. In this embodiment the first sub-window is a 5×5 window, but the size of the first sub-window is not limited. In step S203, a first mask M1 is used to select prior-processed pixels. For example, if the current-processed pixel is a pixel R4, the selected prior-processed pixels are pixels R0, R1, R2, B0, and B1, since pixels R0, R1, R2, B0, and B1 are processed before the pixel R4 according to the scan scheme. Each of the selected prior-processed pixels is red or blue.

In step S204, a set of direction weightings of the current-processed pixel is calculated. In this embodiment, the set of direction weightings comprises a horizontal weighting, a vertical weighting and a flat weighting. The number of the set of direction weightings is not limited to three, for example, in another embodiment, the set of direction weightings can further comprise a northwest-southeast weighting and a northeast-southwest weighting. In demosaicking, "flat" can mean no particular interpolating direction is used when interpolating. Also, an interpolating direction of "flat" can be realized as a combination of all interpolating directions. Note that, in the specification, horizontal is equal to east-west and vertical is equal to north-south. The horizontal weighting $W_H$, the vertical weighting $W_V$ and the flat weighting $W_F$ of the current-processed pixel are calculated respectively from equations illustrated as following:

$$W_H = \sum_{X \in R} W(P_{X,H}) \times W_{recorded}(P_{X,H}),$$

$$W_V = \sum_{Y \in R} W(P_{Y,V}) \times W_{recorded}(P_{Y,V}),$$

and $$W_F = \sum_{Z \in R} W(P_{Z,F}) \times W_{recorded}(P_{Z,F}),$$

wherein R denotes a plurality of pixels considered when calculating direction weightings, $W(P)$ is a weighting of a pixel P of the plurality of pixels, $W_{recorded}(P)$ is a stored direction weighting of the pixel P of the plurality of pixel, $P_{X,H}$ denotes pixels with horizontal interpolating directions in the plurality of pixels, $P_{Y,V}$ denotes pixels with vertical interpolating directions in the plurality of pixels, and the $P_{Z,F}$ denotes pixels with flat interpolating directions in the plurality of pixels. In one example, weightings W of all pixels of the digital image are all 1. FIG. 3b shows an example of data of prior-processed pixels R0, R1, R2, B0, and B1. The prior-processed pixels R0, R1, R2, B0, and B1 are considered when the set of direction weightings of the current-processed pixel R4 is calculated. That is, the prior-processed pixels R0, R1, R2, B0, and B1 make a contribution to calculation of the current-processed pixel R4. Each pixel of the prior-processed pixels stores an interpolating direction and a value of a corresponding stored direction weighting. In FIG. 3b, H denotes horizontal, V denotes vertical, and F denotes flat. According to formulas of direction weightings described above, if weightings of the pixels of the digital image are all 1, the horizontal weighting $W_H$, the vertical weighting $W_V$ and the flat weighting $W_F$ of the current-processed pixel R4 are calculated respectively from equations illustrated as following:

$W_H(R4) = W_H(R0) + W_H(R1),$ $W_V(R4) = W_V(R2) + W_V(B1),$ and $W_F(R4) = W_F(B0).$ Though in the above example red and blue prior-processed pixels are considered, green prior-processed pixels can also be consider as well in other examples.

In step S205, an interpolating direction of the current-processed pixel is determined according to the set of direction weightings of the current-processed pixel. For example, an interpolating direction of the current-processed pixel R4 is a direction of the largest one of $W_H(R4)$, $W_V(R4)$ and $W_F(R4)$.

For example, if the vertical weighting $W_V(R4)$ is larger than the horizontal weighting $W_H(R4)$ and the flat weighting $W_F(R4)$, the interpolating of the current-processed pixel R4 is vertical. In this way, the interpolating of the current-processed pixel R4 is voted by neighboring pixels R0, R1, R2, B0, and B1.

If all three direction weightings are equal, a weighting W of each pixel of the plurality of pixels considered when the set of direction weightings of the current-processed pixel is calculated can be set according to a distance between each pixel and the current-processed pixel. That is, the weighting W of a pixel $P_N$ is:

$$W(P_N) = \frac{1}{\text{Euclidean distance}(P_N \to P_C)},$$

wherein $P_C$ denotes the current-processed pixel.

For example, according to the formula of the weighting W described above, the horizontal weighting $W_H$, the vertical weighting $W_V$ and the flat weighting $W_F$ of the current-processed pixel R4 are calculated respectively from equations illustrated as following:

$$W_H(R4) = \frac{1}{\sqrt{8}} \times W_H(R0) + \frac{1}{2} \times W_H(R1),$$

$$W_V(R4) = \frac{1}{\sqrt{8}} \times W_V(R2) + \frac{1}{\sqrt{2}} \times W_V(B1),$$

and $$W_F(R4) = \frac{1}{\sqrt{2}} \times W_F(B0).$$

In another example, if the interpolating of the current-processed pixel R4 cannot be determined by vote, the set of direction weightings can be re-calculated according to difference (gradient) in green values of corresponding direction, such as following:

$$W'_H(R4) = W_H(R4) + \frac{1}{|DG_H| + 1},$$

$$W'_V(R4) = W_V(R4) + \frac{1}{|DG_V| + 1},$$

and $$W'_F(R4) = W_F(R4) + \frac{1}{(|DG_H| + |DG_V|)/2 + 1},$$

wherein $DG_H$ denotes difference in green values of horizontal and $DG_V$ denotes difference in green values of vertical. Alternatively, the set of direction weightings can be re-calculated as following:

$$W'_H(R4) = \frac{1}{|DG_H| + 1} \times (W_H(R4) + N),$$

$$W'_V(R4) = \frac{1}{|DG_V| + 1} \times (W_V(R4) + N), \text{ and}$$

$$W'_F(R4) = \frac{1}{(|DG_H| + |DG_V|)/2 + 1} \times (W_F(R4) + N),$$

wherein N is a positive integer to make $(W_H(R4)+N)$, $(W_V(R4)+N)$ and $(W_F(R4)+N)$ not zero.

If all three direction weightings are still equal, the interpolating direction of the current-processed pixel R4 is flat and the stored direction weighting is $W_F(R4)$.

In step S206, a green value of the current-processed pixel is calculated based on the set of direction weightings of the current-processed pixel and green values of green pixels in the first sub-window SW1. In this embodiment, the green value G of the current-processed pixel is calculated based on the set of direction weightings of the current-processed pixel, a horizontal green gradient $G_H$, a vertical green gradient $G_V$ and a flat green gradient $G_F$ as the following formula:

$$G = \frac{W_H \times G_H + W_V \times G_V + W_F \times G_F}{W_H + W_V + W_F}.$$

For example, the green value G(R4) of the current-processed pixel R4 is calculated as follows:

$$G_H(R4) = \frac{G(G_5) + G(G_6)}{2},$$

$$G_V(R4) = \frac{G(G_3) + G(G_8)}{2},$$

$$G_F(R4) = \frac{G(G_3) + G(G_5) + G(G_6) + G(G_8)}{4}, \text{ and}$$

$$G(R4) = \frac{W_H(R4) \times G_H(R4) + W_V(R4) \times G_V(R4) + W_F(R4) \times G_F(R4)}{W_H(R4) + W_V(R4) + W_F(R4)}.$$

After step S206, the interpolating direction, the direction weighting corresponding to the interpolating direction and the green value of the current-processed pixel are obtained and stored. For example, if the interpolating direction of the current-processed pixel R4 is vertical, the stored data for the current-processed pixel R4 is the vertical interpolating direction, the vertical weighting $W_V(R4)$ and the green value G(R4).

Figure 1:
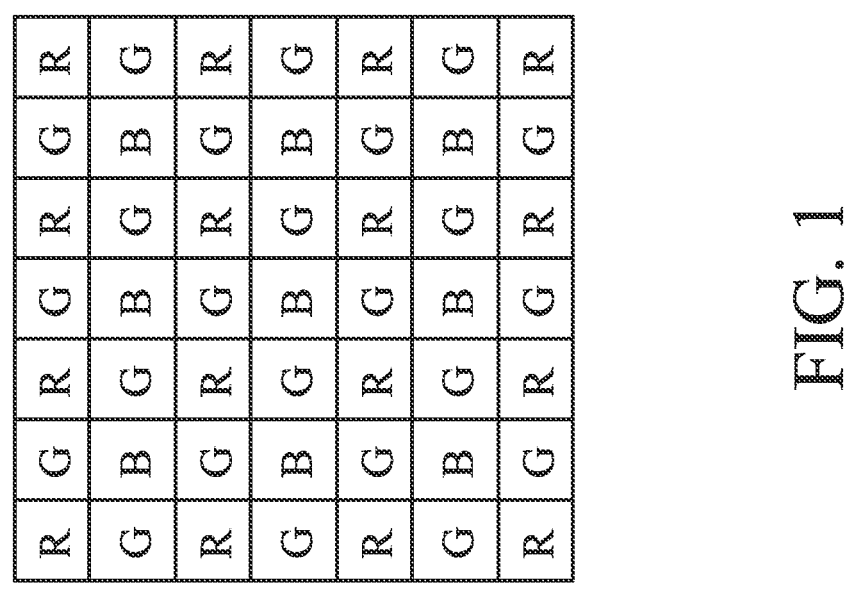

In step S207, the green value of the current-processed pixel is re-estimated according to not only prior-processed pixel but also non-processed pixels. In the example shown in the FIG. 3a, when the pixel R4 is processed, pixels G6~G11, R5~R8 and B2~B4 are non-processed pixels. In order to consider non-processed pixels, interpolating directions of the non-processed pixels can be estimated according to at least the current-processed pixel. FIG. 3c shows an example of estimating an interpolating direction of a non-processed pixel R6. The first mask M1 is used to select pixels R3, R4, R9, B2 and B4 for the pixel R6. Noted, though the mask used in FIG. 3c is the same as the mask used in FIG. 3a, the mask used in FIG. 3c may be different from the mask used in FIG. 3a in other examples. The interpolating direction of the pixel R6 is voted by pixels R3, R4, R9, B2 and B4, in the same manner of the example for determining the interpolation direction of the pixel R4 as described above in step S204 and S205. Interpolating directions of pixels B2 and B4 and other non-processed pixels can also be voted in the same manner of the example for determining the interpolation direction of the pixel R4 as described above in step S204 and S205. After interpolating directions of the non-processed pixels R5~R8 and B2~B4 are estimated, the interpolating direction of the current-processed pixel R4 is re-calculated according to interpolating directions and corresponding direction weightings of the pixels R0~R8 and B0~B3 in the first sub window SW1. That is, the current-processed pixel R4 is re-voted by the pixels R0~R8 and B0~B3. FIG. 3d-1 and FIG. 3d-2 show an example of data of pixels R0~R8 and B0~B3, wherein the data of the pixel R4 is obtained from steps S202 to S205. If the weightings of the pixels are all 1, the set of direction weightings of the pixel R4 is re-calculated according to the pixels R0~R8 and B0~B3 respectively from equations illustrated as following:

$$W_H(R4)=W_H(R0)+W_H(R1)+W_H(R7)+W_H(R8),$$

$$W_V(R4)=W_V(R2)+W_V(R4)+W_V(R5)+W_V(R6)+W_V(B1)+W_V(B3), \text{ and}$$

$$W_F(R4)=W_F(R3)+W_F(B0)+W_F(B2).$$

In another example, if a weighting of each pixel is decided according to a distance between each pixel and the current-processed pixel, the set of direction weightings of the current-processed pixel R4 is re-calculated as follows:

$$W_H(R4) = \frac{1}{\sqrt{8}} \times W_H(R0) + \frac{1}{2} \times W_H(R1) + \frac{1}{2} \times W_H(R7) + \frac{1}{\sqrt{8}} \times W_H(R8),$$

$$W_V(R4) = \frac{1}{\sqrt{8}} \times W_V(R2) + a \times W_V(R4) + \frac{1}{2} \times W_V(R5) +$$
$$\frac{1}{\sqrt{8}} \times W_V(R6) + \frac{1}{\sqrt{2}} \times W_V(B1) + \frac{1}{\sqrt{2}} \times W_V(B3), \text{ and}$$

$$W_F(R4) = \frac{1}{\sqrt{2}} \times W_F(B0) + \frac{1}{2} \times W_F(R3) + \frac{1}{\sqrt{2}} \times W_F(B2),$$

wherein because the Euclidean distance from R4 to R4 itself is 0, the weighting of the pixel R4 is specially designed as any user-defined parameter a. In one example, a is 1.

After the set of direction weightings of the pixel R4 is re-calculated, the interpolating direction of the current-processed pixel R4 is re-determined according to the set of direction weightings of the pixel R4. For example, the interpolating direction of the current-processed pixel R4 is a direction of the largest one of re-calculated $W_H(R4)$, $W_V(R4)$ and $W_F(R4)$. Then the green value of the current-processed pixel R4 is re-determined by the following formula:

$$G = \frac{W_H \times G_H + W_V \times G_V + W_F \times G_F}{W_H + W_V + W_F},$$

wherein $G_H$, $G_V$ and $G_F$ are the horizontal green gradient, the vertical green gradient and the flat green gradient, respectively, as described above.

After the step S207, the re-determined interpolating direction, the re-calculated direction weighting corresponding to the re-determined interpolating direction and the re-calculated green value of the current-processed pixel is re-stored.

In another embodiment, the step S207 can be eliminated; that is, the green value of the current-processed pixel may not be re-estimated.

After the green value of the current-processed pixel is obtained, the third process (steps S208~S210) is implemented to the current-processed pixel to obtain a blue value or a red value of the current-processed pixel. In step S208, the color of the current-processed pixel is determined. If the current-processed pixel is red, a blue value of the current-processed pixel is calculated in step S209. If the current-processed pixel is blue, a red value of the current-processed pixel is calculated in step S210.

In step S209, the blue value B of the current-processed pixel is calculated based on the green value of the current-processed pixel and stored direction weightings and difference in values between green and blue of blue pixels neighboring the current-processed pixel, wherein each of the blue pixels neighboring the current-processed pixel has the same stored interpolating direction as the current-processed pixel, as the equation illustrated below:

$$B = G - \frac{\Sigma[W_N(P_B) \times (G(P_B) - B(P_B))]}{\Sigma W_N(P_B)},$$

wherein $P_B$ denotes pixels in the first sub-window SW1 that have the same interpolating direction N as the current-processed pixel, and N is one of horizontal, vertical and flat. Take FIG. 3d-1 and FIG. 3d-2 as an example. The stored interpolating direction of the current-processed pixel R4 is vertical. Since interpolating directions of pixels B1 and B3 are also vertical (the interpolating direction of the non-processed pixel B3 can be estimated in the same manner as that described in step S207), the blue value of the current-processed pixel R4 is:

$$B(R4) = G(R4) - \frac{W_V(B1) \times (G(B1) - B(B1)) + W_V(B3) \times (G(B3) - B(B3))}{W_V(B1) + W_V(B3)}.$$

In another example, if there is no pixel in the first sub-window SW1 that has the same interpolating direction N as the current-processed pixel, the blue value B of the current-processed pixel can be calculated as following:

$$B = G - \frac{\Sigma(G(P_{B'}) - B(P_{B'}))}{Num(P_{B'})},$$

wherein $P_{B'}$ denotes all blue pixels in the first sub-window SW1 and $Num(P_{B'})$ denotes the number of all blue pixels in the first sub-window SW1. For example, assume the stored interpolating direction of the current-processed pixel R4 is horizontal, then the blue value of the current-processed pixel R4 is:

$$B(R4) = G(R4) - \frac{(G(B0) - B(B0)) + (G(B1) - B(B1)) + (G(B2) - B(B2)) + (G(B3) - B(B3))}{4}$$

If the current-processed pixel is blue, the red value of the current-processed pixel is calculated in step S210. The algorithm of calculating the red value of the blue current-processed pixel is similar to calculating the blue value of the red current-processed pixel in step S209 described above, since a Bayer picture with a red pixel that is centered is symmetrical to a Bayer picture with a blue pixel that is centered.

Figure 4:
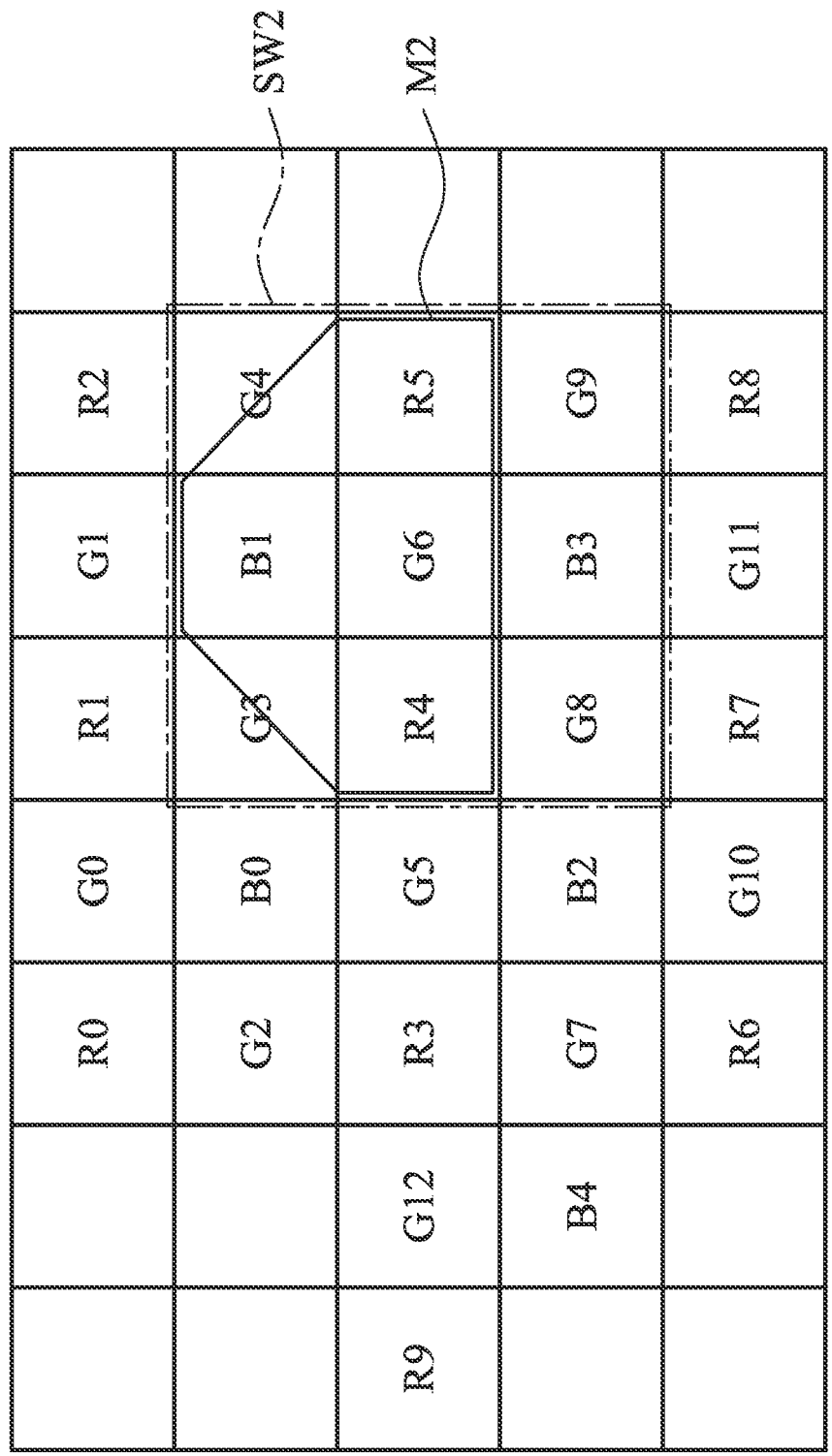
FIG. 4 illustrates an example of demosaicking a green pixel.

If the current-processed pixel is green, a second process (steps S211~S219) is implemented to the current-processed pixel to obtain a red value and a blue value of the current-processed pixel. In step S211, a second sub-window SW2 centered at the current-processed pixel is generated, as shown in FIG. 4. FIG. 4 shows a part of a digital image captured by an image sensor overlaid with a Bayer color filter array. In this embodiment the second sub-window is a 3×3 window, but the size of the second sub-window is not limited, for example, the second sub-window can be a 5×5 window. In step S212, a second mask M2 is used to select prior-processed blue and red pixels. In the example of FIG. 4, the current-processed pixel is pixel G6, and the selected prior-processed green pixels are pixels B1, R4 and R5.

In step S213, a set of direction weightings of the green current-processed pixel is calculated as described in step S204. In another embodiment, since the set of direction weightings of the green current-processed pixel is previously estimated, as described in step S207, the green current-processed pixel may continue to use the previously estimated set of direction weightings. In step S214, an interpolating direction of the green current-processed pixel is determined according to the set of direction weightings of the green current-processed pixel. For example, if the horizontal weighting $W_H(G6)$ is larger than the vertical weighting $W_V(G6)$ and the flat weighting $W_F(G6)$ the interpolating of the green current-processed pixel G6 is horizontal. In step S215, green values of red or blue non-processed pixels in the second sub-window are estimated. For example, green values of a blue non-processed pixel B3 and a red non-processed pixel R5 are estimated as described in steps S202 to S207. After step S215, all green values of pixels neighboring the green current-processed pixel are known. For example, green values of pixels B1, B3, R4 and R5 are known. In step S216, red values of blue non-processed pixels in the second sub-window are estimated. For example, a red value of the blue non-processed pixel B3 is estimated as described in step S210. After step S216, all red values of the pixels neighboring the green current-processed pixel are known. For example, red values of the pixels B1, B3, R4 and R5 are known. In step S217, a red value of the green current-processed pixel is calculated based on the red values of the pixels neighboring the current-processed pixel and the set of direction weightings of the current-processed pixel. For example, a red value of the green current-processed pixel G6 is calculated based on the set of direction weightings of the pixel G6 and the red values of neighboring pixels B1, B3, R4 and R5 such as:

$$R_H(G6) = \frac{R(R4) + R(R5)}{2},$$
$$R_V(G6) = \frac{R(B1) + R(B3)}{2},$$
$$R_F(G6) = \frac{R(B1) + R(B3) + R(R4) + R(R5)}{4}, \text{ and}$$
$$R(G6) = \frac{W_H(G6) \times R_H(G6) + W_V(G6) \times R_V(G6) + W_F(G6) \times R_F(G6)}{W_H(G6) + W_V(G6) + W_F(G6)}.$$

In step S218, blue values of red non-processed pixels in the second sub-window are estimated. For example, a blue value of the red non-processed pixel R5 is estimated as described in step S209. After step S218, all blue values of the pixels neighboring the green current-processed pixel are known. For example, blue values of the pixels B1, B3, R4 and R5 are known. In step S219, a blue value of the green current-processed pixel is calculated based on the blue values of the pixels neighboring the current-processed pixel and the set of direction weightings of the current-processed pixel. For example, a blue value of the green current-processed pixel G6 is calculated based on the set of direction weightings of the pixel G6 and the blue values of the neighboring pixels B1, B3, R4 and R5 such as:

$$B_H(G6) = \frac{B(R4) + B(R5)}{2},$$
$$B_V(G6) = \frac{B(B1) + B(B3)}{2},$$
$$B_F(G6) = \frac{B(B1) + B(B3) + B(R4) + B(R5)}{4}, \text{ and}$$
$$B(G6) = \frac{W_H(G6) \times B_H(G6) + W_V(G6) \times B_V(G6) + W_F(G6) \times B_F(G6)}{W_H(G6) + W_V(G6) + W_F(G6)}.$$

After the step S219, the red value and the blue value of the green current-processed pixel are known. In one embodiment, after steps S201 to S219, values of three colors of the current-processed and some neighboring pixels can be used in other image processing in other image pipelines, such as sharpening, smoothing or/and denoising. Steps S201 to S219 are repeated to all the pixels of the digital image (steps S220~S221).

The method for demosaicking described above may take the form of a program code (i.e., instructions) embodied on a non-transitory machine-readable storage medium such as floppy diskettes, CD-ROMS, hard drives, firmware, or any other machine-readable storage medium. When the program code is loaded into and executed by a machine, such as a digital imaging device or a computer, the machine implements the method for demosaicking.

Figure 5:
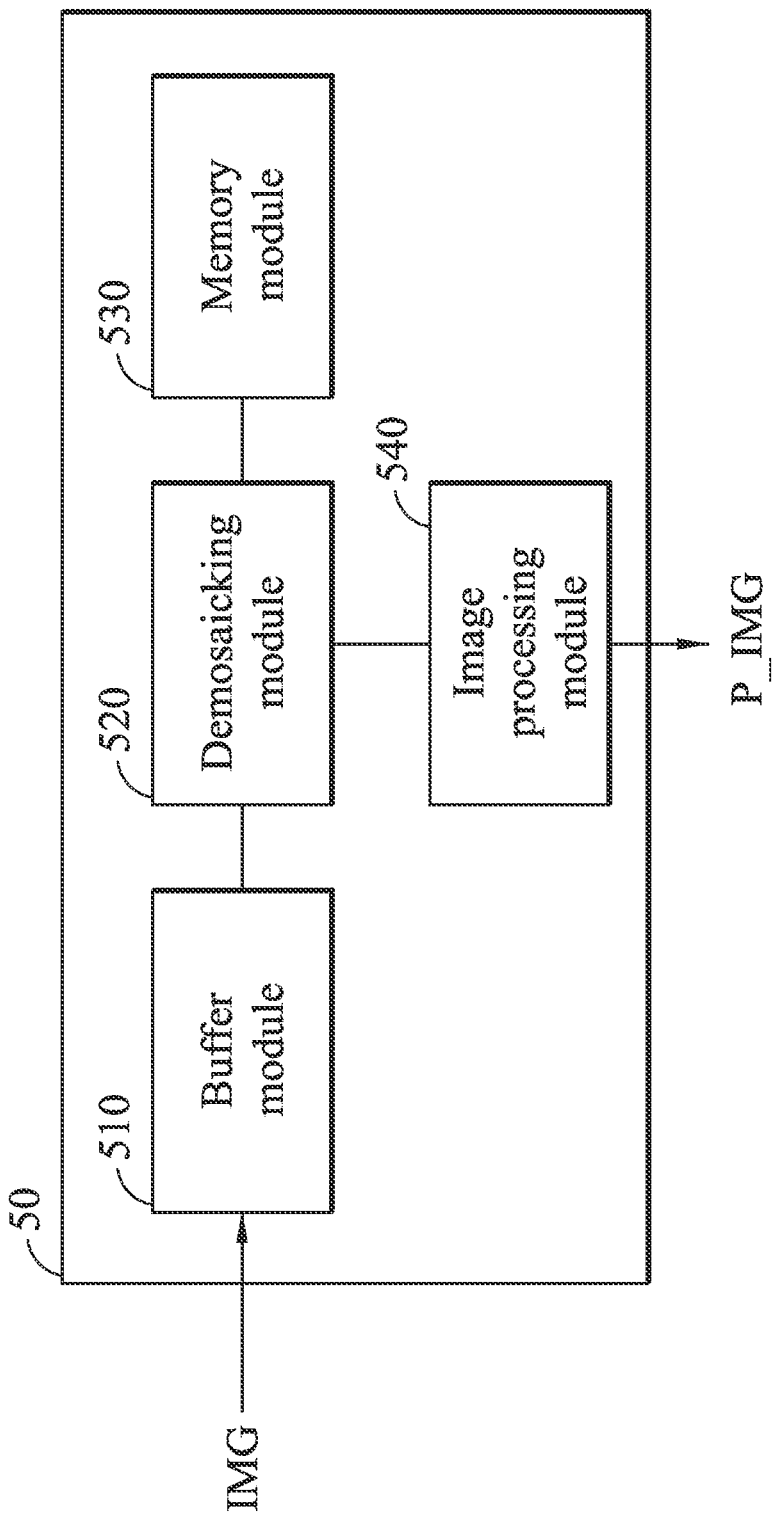
FIG. 5 illustrates an image signal processor for demosaicking a digital image in accordance with an embodiment of the invention.

FIG. 5 illustrates an image signal processor 50 for demosaicking a digital image in accordance with an embodiment of the invention. In this embodiment, the digital image IMG is captured by an image sensor overlaid with a Bayer color filter array. Each pixel of the digital image has only a green value, a red value or a blue value. The image signal processor 50 comprises a buffer module 510, a demosaicking module 520, a memory module 530 and an image processing module 540.

The buffer module 510 receives the digital image IMG. The demosaicking module 520 is coupled to the buffer module 510 and implements demosaicking to each pixel of the digital image IMG to reconstruct values of two other missing colors. The memory module 530 is coupled to the demosaicking module 520 and stores the interpolating direction, the direction weighting corresponding to the interpolating direction and data used when the demosaicking module 520 implements steps S201 to S219 of the demosaicking method as described above to each pixel. The image processing module 540 is coupled to the demosaicking module 520, receives a green value, a red value and a blue value of each pixels to implement a image processing process on each pixel based on the values, such as sharpening, smoothing, denoising or/and other image processing processes. After being processed, a processed image P_IMG is output.

Methods and apparatuses of the present disclosure, or certain aspects or portions of embodiments thereof, may take the form of a program code (i.e., instructions) embodied in media, such as floppy diskettes, CD-ROMS, hard drives, firmware, or any other machine-readable storage medium, wherein, when the program code is loaded into and executed by a machine, such as a computer, the machine becomes an apparatus for practicing embodiments of the disclosure. The methods and apparatus of the present disclosure may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing and embodiment of the disclosure. When implemented on a general-purpose processor, the program code combines with the processor to provide a unique apparatus that operates analogously to specific logic circuits.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for demosaicking a digital image captured by an image sensor overlaid with a color filter array, wherein each of pixels of the digital image has one of a first color, a second color and a third color, and the pixels of the digital image are processed in an order from the upper-left to lower-right of the digital image, the method comprising:
    if a current-processed pixel is the second color or the third color, implementing a first process to the current-processed pixel to obtain a value of the first color, wherein the first process comprises:
    generating a first sub-window centered at the current-processed pixel;
    using a first mask to select a first plurality of prior-processed pixels;
    calculating a set of direction weightings of the current-processed pixel according to stored direction weightings of the first plurality of prior-processed pixels;
    determining an interpolating direction of the current-processed pixel according to the set of direction weightings of the current-processed pixel;
    calculating a value of the first color for the current-processed pixel based on the set of direction weightings of the current-processed pixel and values of the first color of pixels of the first color in the first sub-window;
    storing the largest one of the set of direction weightings, the interpolating direction and the value of the first color of the current-processed pixel; and
    if the current-processed pixel is the first color, implementing a second process to the current-processed pixel to obtain a value of the second color and a value of the third color, wherein the second process comprises:
    generating a second sub-window centered at the current-processed pixel;
    using a second mask to select a second plurality of prior-processed pixels;
    calculating a set of direction weightings of the current-processed pixel according to stored direction weightings of the second plurality of prior-processed pixels;
    determining an interpolating direction of the current-processed pixel according to the set of direction weightings of the current-processed pixel;
    storing the largest one of the set of direction weightings of the current-processed pixel;
    implementing the first process to each of a first plurality of non-processed pixels to estimate a value of the first color for each of the first plurality of non-processed pixels, wherein each of the first plurality of non-processed pixels is the second color or the third color and in the second sub-window;
    estimating a value of the second color for each of a second plurality of non-processed pixels, wherein each of the second plurality of non-processed pixels is the third color and in the second sub-window;
    calculating a value of the second color for the current-processed pixel based on values of the second color of pixels neighboring the current-processed pixel and the set of direction weightings of the current-processed pixel;
    estimating a value of the third color for each of a third plurality of non-processed pixels, wherein each of the third plurality of non-processed pixels is the second color and in the second sub-window; and
    calculating a value of the third color for the current-processed pixel based on values of the third color of the pixels neighboring the current-processed pixel and the set of direction weightings of the current-processed pixel.

2. The method as claimed in claim 1, further comprises:
    implementing a re-estimating process to the current-processed pixel to re-estimate the value of the first color of the current-processed pixel after the first process is implemented to the current-processed pixel, wherein the re-estimating process comprises:
    implementing the first process to each of a fourth plurality of non-processed pixels to estimate a set of direction weightings, an interpolating direction, a stored direction weighting and a value of the first color for each of the fourth plurality of non-processed pixels, wherein each of the fourth plurality of non-processed pixels is in the first sub-window;
    re-calculating the set of direction weightings of the current-processed pixel according to stored direction weightings of the current-processed pixel, the fourth plurality of non-processed pixels and a fourth plurality of prior-processed pixels, wherein each of the fourth plurality of prior-processed pixels is in the first sub-window;
    re-determining the interpolating direction of the current-processed pixel according to the set of direction weightings of the current-processed pixel;
    re-calculating the value of the first color for the current-processed pixel based on the set of direction weightings of the current-processed pixel and the values of the first color of the pixels of the first color in the first sub-window; and
    re-storing the largest one of the set of direction weightings, the interpolating direction and the value of the first color of the current-processed pixel.

3. The method as claimed in claim 2, further comprises:
    if the current-processed pixel is the second color or the third color, implementing a third process to the current-processed pixel to obtain a value of the third color or a value of the second color for the current-processed pixel, wherein the third process comprises:
    if the current-processed pixel is the second color, calculating the value of the third color for the current-processed pixel based on the value of the first color of the current-processed pixel and difference in values between the first color and the third color of pixels of the third color neighboring the current-processed pixel; and
    if the current-processed pixel is the third color, calculating the value of the second color for the current-processed pixel based on the value of the first color of the current-processed pixel and difference in values between the first color and the second color of pixels of the second color neighboring the current-processed pixel.

4. The method as claimed in claim 3, wherein the set of direction weightings comprises a horizontal weighting, a vertical weighting and a flat weighting.

5. The method as claimed in claim 4, wherein calculating a set of direction weightings of a pixel P according to stored direction weightings of a plurality R of reference pixels further comprises:

obtaining the horizontal weighting, the vertical weighting and the flat weighting of the pixel P respectively from:

$$W_H(P) = \sum_{X \in R} W(P_{X,H}) \times W_{recorded}(P_{X,H});$$

$$W_V(P) = \sum_{Y \in R} W(P_{Y,V}) \times W_{recorded}(P_{Y,V}); \text{ and}$$

$$W_F(P) = \sum_{Z \in R} W(P_{Z,F}) \times W_{recorded}(P_{Z,F}),$$

wherein W is a weighting of a pixel, $W_{recorded}$ is a stored direction weighting of the pixel, the largest one of the set of direction weightings of pixels $P_{X,H}$ is the horizontal weighting, the largest one of the set of direction weightings of pixels $P_{Y,V}$ is the vertical weighting, and the largest one of the set of direction weightings of pixels $P_{Z,F}$ is the flat weighting.

6. The method as claimed in claim 5, wherein the interpolating direction of the current-processed pixel is a direction of the largest one of the set of direction weightings.

7. The method as claimed in claim 6, wherein weightings of the pixels of the digital image are 1.

8. The method as claimed in claim 6, wherein the weighting W of a pixel $P_N$ is:

$$W(P_N) = \frac{1}{\text{Euclidean distance}(P_N \to P)}.$$

9. The method as claimed in claim 6, wherein the color filter array is a Bayer color filter array, and the first color is green, the second color is red, and the third color is blue.

10. A non-transitory machine-readable storage medium, having an encoded program code, wherein when the program code is loaded into and executed by a machine, the machine implements a method for demosaicking a digital image captured by an image sensor overlaid with a color, wherein each of pixels of the digital image has one of a first color, a second color and a third color, and the pixels of the digital image are processed in an order from the upper-left to lower-right of the digital image, and the method comprises:

if a current-processed pixel is the second color or the third color, implementing a first process to the current-processed pixel to obtain a value of the first color, wherein the first process comprises:

generating a first sub-window centered at the current-processed pixel;

using a first mask to select a first plurality of prior-processed pixels;

calculating a set of direction weightings of the current-processed pixel according to stored direction weightings of the first plurality of prior-processed pixels;

determining an interpolating direction of the current-processed pixel according to the set of direction weightings of the current-processed pixel;

calculating a value of the first color for the current-processed pixel based on the set of direction weightings of the current-processed pixel and values of the first color of pixels of the first color in the first sub-window;

storing the largest one of the set of direction weightings, the interpolating direction and the value of the first color of the current-processed pixel; and if the current-processed pixel is the first color, implementing a second process to the current-processed pixel to obtain a value of the second color and a value of the third color, wherein the second process comprises:

generating a second sub-window centered at the current-processed pixel;

using a second mask to select a second plurality of prior-processed pixels;

calculating a set of direction weightings of the current-processed pixel according to stored direction weightings of the second plurality of prior-processed pixels;

determining an interpolating direction of the current-processed pixel according to the set of direction weightings of the current-processed pixel;

storing the largest one of the set of direction weightings of the current-processed pixel;

implementing the first process to each of a first plurality of non-processed pixels to estimate a value of the first color for each of the first plurality of non-processed pixels, wherein each of the first plurality of non-processed pixels is the second color or the third color and in the second sub-window;

estimating a value of the second color for each of a second plurality of non-processed pixels, wherein each of the second plurality of non-processed pixels is the third color and in the second sub-window;

calculating a value of the second color for the current-processed pixel based on values of the second color of pixels neighboring the current-processed pixel and the set of direction weightings of the current-processed pixel;

estimating a value of the third color for each of a third plurality of non-processed pixels, wherein each of the third plurality of non-processed pixels is the second color and in the second sub-window; and calculating a value of the third color for the current-processed pixel based on values of the third color of the pixels neighboring the current-processed pixel and the set of direction weightings of the current-processed pixel.

11. The non-transitory machine-readable storage medium as claimed in claim 10, wherein the method further comprises:

implementing a re-estimating process to the current-processed pixel to re-estimate the value of the first color of the current-processed pixel after the first process is implemented to the current-processed pixel, wherein the re-estimating process comprises:

implementing the first process to each of a fourth plurality of non-processed pixels to estimate a set of direction weightings, an interpolating direction, a stored direction weighting and a value of the first color for each of the fourth plurality of non-processed pixels, wherein each of the fourth plurality of non-processed pixels is in the first sub-window;

re-calculating the set of direction weightings of the current-processed pixel according to stored direction weightings of the current-processed pixel, the fourth plurality of non-processed pixels and a fourth plurality of prior-processed pixels, wherein each of the fourth plurality of prior-processed pixels is in the first sub-window;

re-determining the interpolating direction of the current-processed pixel according to the set of direction weightings of the current-processed pixel;

re-calculating the value of the first color for the current-processed pixel based on the set of direction weightings of the current-processed pixel and the values of the first color of the pixels of the first color in the first sub-window; and re-storing the largest one of the set of direction weightings, the interpolating direction and the value of the first color of the current-processed pixel.

12. The non-transitory machine-readable storage medium as claimed in claim 11, wherein the method further comprises:

if the current-processed pixel is the second color or the third color, implementing a third process to the current-processed pixel to obtain a value of the third color or a value of the second color for the current-processed pixel, wherein the third process comprises:

if the current-processed pixel is the second color, calculating the value of the third color for the current-processed pixel based on the value of the first color of the current-processed pixel and difference in values between the first color and the third color of pixels of the third color neighboring the current-processed pixel; and if the current-processed pixel is the third color, calculating the value of the second color for the current-processed pixel based on the value of the first color of the current-processed pixel and difference in values between the first color and the second color of pixels of the second color neighboring the current-processed pixel.

13. The non-transitory machine-readable storage medium as claimed in claim 12, wherein the set of direction weightings comprises a horizontal weighting, a vertical weighting and a flat weighting.

14. The non-transitory machine-readable storage medium as claimed in claim 13, wherein calculating a set of direction weightings of a pixel P according to stored direction weightings of a plurality R of reference pixels further comprises:

obtaining the horizontal weighting, the vertical weighting and the flat weighting of the pixel P respectively from:

$$W_H(P) = \sum_{X \in R} W(P_{X,H}) \times W_{recorded}(P_{X,H});$$

$$W_V(P) = \sum_{Y \in R} W(P_{Y,V}) \times W_{recorded}(P_{Y,V}); \text{ and}$$

$$W_F(P) = \sum_{Z \in R} W(P_{Z,F}) \times W_{recorded}(P_{Z,F}),$$

wherein W is a weighting of a pixel, $W_{recorded}$ is a stored direction weighting of the pixel, the largest one of the set of direction weightings of pixels $P_{X,H}$ is the horizontal weighting, the largest one of the set of direction weightings of pixels $P_{Y,V}$ is the vertical weighting, and the largest one of the set of direction weightings of pixels $P_{Z,F}$ is the flat weighting.

15. The non-transitory machine-readable storage medium as claimed in claim 14, wherein the interpolating direction of the current-processed pixel is a direction of the largest one of the set of direction weightings.

16. The non-transitory machine-readable storage medium as claimed in claim 15, wherein weightings of the pixels of the digital image are 1.

17. The non-transitory machine-readable storage medium as claimed in claim 15, wherein the weighting W of a pixel $P_N$ is:

$$W(P_N) = \frac{1}{\text{Euclidean distance}(P_N \to P)}.$$

18. The non-transitory machine-readable storage medium as claimed in claim 15, wherein the color filter array is a Bayer color filter array, and the first color is green, the second color is red, and the third color is blue.

19. An image signal processor for processing a digital image captured by an image sensor overlaid with a color filter array, wherein each of pixels of the digital image has one of a first color, a second color and a third color, and the pixels of the digital image are processed in an order from the upper-left to lower-right of the digital image, comprising:

a buffer module, receiving the digital image;

a demosaicking module coupled to the buffer module, demosaicking each of the pixels of the digital image to reconstruct values of two other missing colors;

a memory module coupled to the demosaicking module; and an image processing module coupled to the demosaicking module, receiving values of the first color, the second color and the third color of each of the pixels to implement an image processing process to each of the pixels based on the values, wherein if a current-processed pixel currently processed by the demosaicking module is the second color or the third color, the demosaicking module generates a first sub-window centered at the current-processed pixel, wherein a first mask is used to select a first plurality of prior-processed pixels, calculates a set of direction weightings of the current-processed pixel according to stored direction weightings of the first plurality of prior-processed pixels, determines an interpolating direction of the current-processed pixel according to the set of direction weightings of the current-processed pixel, calculates a value of the first color for the current-processed pixel based on the set of direction weightings of the current-processed pixel and values of the first color of pixels of the first color in the first sub-window, stores the largest one of the set of direction weightings, the interpolating direction and the value of the first color of the current-processed pixel at the memory module, and transmits the value of the first color of the current-processed pixel to the image processing module; and wherein if the current-processed pixel is the first color, the demosaicking module generates a second sub-window centered at the current-processed pixel, uses a second mask to select a second plurality of prior-processed pixels, calculates a set of direction weightings of the current-processed pixel according to direction weightings of the second plurality of prior-processed pixels, determines an interpolating direction of the current-processed pixel according to the set of direction weightings of the current-processed pixel, estimate a value of the first color for each of a first plurality of non-processed pixels, wherein each of the first plurality of non-processed pixels is the second color or the third color and in the second sub-window, estimates a value of the second color for each of a second plurality of non-processed pixels, wherein each of the second plurality of non-processed pixels is the third color and in the second sub-window, calculates a value of the second color for the current-processed pixel based on values of the second color of pixels neighboring the current-processed pixel and the set of direction weightings of the current-processed pixel, estimates a value of the third color for each of a third plurality of non-processed pixels, wherein each of the third plurality of non-processed pixels is the second color and in the second sub-window, calculates a value of the third color for the current-processed pixel based on values of the third color of the pixels neighboring the current-processed pixel and the set of direction weightings of the current-processed pixel, stores the largest one of the set of direction weightings, the interpolating direction, the value of the second color and the value of the third color of the current-processed pixel at the memory module, and transmits the value of the second color and the value of the third color of the current-processed pixel to the image processing module.

* * * * *